(12) United States Patent
Murakami et al.

(10) Patent No.: US 11,598,005 B2
(45) Date of Patent: Mar. 7, 2023

(54) DEPOSITION APPARATUS INCLUDING AN OFF-AXIS LIFT-AND-ROTATION UNIT AND METHODS FOR OPERATING THE SAME

(71) Applicant: SANDISK TECHNOLOGIES LLC, Addison, TX (US)

(72) Inventors: Shoichi Murakami, Yokkaichi (JP); Shigeru Nakatsuka, Yokkaichi (JP); Syo Fukata, Yokkaichi (JP); Yusuke Osawa, Yokkaichi (JP); Shigehiro Fujino, Yokkaichi (JP); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 307 days.

(21) Appl. No.: 16/868,787

(22) Filed: May 7, 2020

(65) Prior Publication Data
US 2021/0348272 A1 Nov. 11, 2021

(51) Int. Cl.
*H01L 21/683* (2006.01)
*C23C 16/458* (2006.01)
(Continued)

(52) U.S. Cl.
CPC ........ *C23C 16/4584* (2013.01); *C23C 16/455* (2013.01); *C23C 16/50* (2013.01); *H01J 37/3244* (2013.01); *H01J 37/32715* (2013.01); *H01L 21/02115* (2013.01); *H01L 21/02274* (2013.01); *H01L 21/0332* (2013.01); *H01L 21/0337* (2013.01); *H01L 21/6833* (2013.01); *H01L 21/68742* (2013.01);
(Continued)

(58) Field of Classification Search
CPC ... C23C 16/4584; C23C 16/455; C23C 16/50; C23C 16/042; C23C 16/26; C23C 16/45502; C23C 16/45523; C23C 16/4586; C23C 16/46; H01J 37/3244; H01J 37/32715; H01J 2237/20214; H01J 2237/3321; H01J 2237/3323; H01L 21/02115; H01L 21/02274; H01L 21/0332; H01L 21/0337; H01L 21/6833; H01L 21/68742; H01L 21/67103; H01L 21/6831; H01L 21/68785
See application file for complete search history.

(56) References Cited

U.S. PATENT DOCUMENTS

2018/0135172 A1* 5/2018 Nogami ............. C23C 16/4586
2018/0158716 A1 6/2018 Konkola et al.
2019/0229008 A1* 7/2019 Rokkam ........... H01L 21/68742

OTHER PUBLICATIONS

U.S. Appl. No. 16/535,505, filed Aug. 8, 2019, SanDisk Technologies LLC.
(Continued)

*Primary Examiner* — Karen Kusumakar
(74) *Attorney, Agent, or Firm* — The Marbury Law Group PLLC (57) ABSTRACT

A deposition chamber includes a vacuum enclosure, an electrostatic chuck having a flat top surface located within a vacuum enclosure, a lift-and-rotation unit extending through or laterally surrounding the electrostatic chuck at a position that is laterally offset from a vertical axis passing through a geometrical center of the electrostatic chuck, a gas supply manifold configured to provide influx of gas into the vacuum enclosure, and a pumping port connected to the vacuum enclosure.

13 Claims, 7 Drawing Sheets

(51) Int. Cl.
*H01L 21/02* (2006.01)
*H01L 21/687* (2006.01)
*H01J 37/32* (2006.01)
*H01L 21/033* (2006.01)
*C23C 16/50* (2006.01)
*C23C 16/455* (2006.01)

(52) U.S. Cl.
CPC ............... *H01J 2237/20214* (2013.01); *H01J 2237/3321* (2013.01); *H01J 2237/3323* (2013.01)

(56) References Cited

OTHER PUBLICATIONS

U.S. Appl. No. 16/867,818, filed May 6, 2020, SanDisk Technologies LLC.
U.S. Appl. No. 16/867,845, filed May 6, 2020, SanDisk Technologies LLC.

\* cited by examiner

DEPOSITION APPARATUS INCLUDING AN OFF-AXIS LIFT-AND-ROTATION UNIT AND METHODS FOR OPERATING THE SAME

FIELD

The present disclosure relates generally to the field of semiconductor manufacturing apparatuses and particularly to a deposition apparatus including an off-axis lift-and-rotation unit and methods for operating the same.

BACKGROUND

Non-uniformity in the thickness of a deposited film can adversely impact subsequent processing steps such as a lithographic patterning process and/or an etch process. Further, non-uniformity in the thickness of a deposited film increases variations in device parameters of semiconductor devices and interconnect structures. A film with high thickness uniformity across a substrate is desired.

SUMMARY

According to an aspect of the present disclosure, a deposition chamber is provided, which comprises: an electrostatic chuck having a flat top surface and a plurality of arc-shaped holes therethrough and located within a vacuum enclosure; a gas supply manifold configured to provide influx of gas into the vacuum enclosure; a pumping port connected to the vacuum enclosure; and a plurality of lift pins located within a respective arc-shaped hole of the plurality of arc-shaped holes and configured to protrude above a horizontal plane including the flat top surface of the electrostatic chuck in a raised position and to be retracted below the horizontal plane including the flat top surface of the electrostatic chuck in a retracted position.

According to another aspect of the present disclosure, a deposition chamber includes a vacuum enclosure, an electrostatic chuck having a flat top surface located within a vacuum enclosure, a lift-and-rotation unit extending through or laterally surrounding the electrostatic chuck at a position that is laterally offset from a vertical axis passing through a geometrical center of the electrostatic chuck, a gas supply manifold configured to provide influx of gas into the vacuum enclosure, and a pumping port connected to the vacuum enclosure.

According to yet another aspect of the present disclosure, a method of depositing a film in a deposition chamber is provided, which comprises: providing a deposition chamber, wherein the deposition chamber comprises an electrostatic chuck having a flat top surface and located within a vacuum enclosure, and a lift-and-rotation unit extending through or laterally surrounding the electrostatic chuck at a position that is laterally offset from a vertical axis passing through a geometrical center of the electrostatic chuck, disposing a substrate on top of the electrostatic chuck, depositing a first film portion on the substrate, lifting the substrate from the electrostatic chuck employing the lift-and-rotation unit, rotating the lifted substrate relative to the electrostatic chuck by rotating the lift-and-rotation unit while the substrate is supported by the lift-and-rotation unit, placing the substrate on the electrostatic chuck after the substrate is rotated, and depositing a second film portion on the substrate.

DETAILED DESCRIPTION

As discussed above, the present disclosure is directed to a deposition apparatus including an off-axis lift-and-rotation unit and methods for operating the same, the various aspects of which are described herebelow in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Figure 1A:
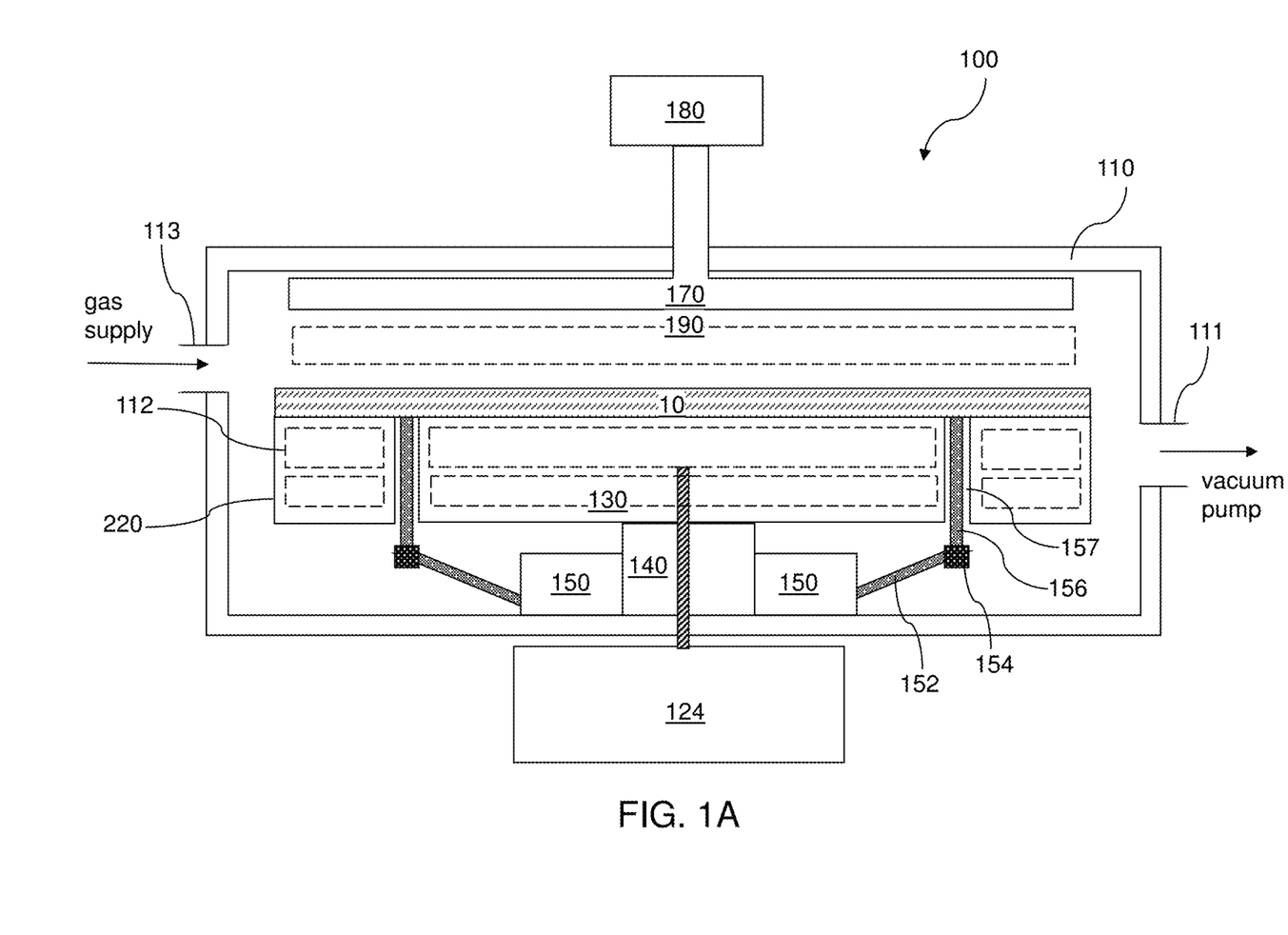
FIG. 1A is a vertical cross-sectional view of a first exemplary deposition chamber while lift pins are retracted according to a first embodiment of the present disclosure.
Figure 1B:
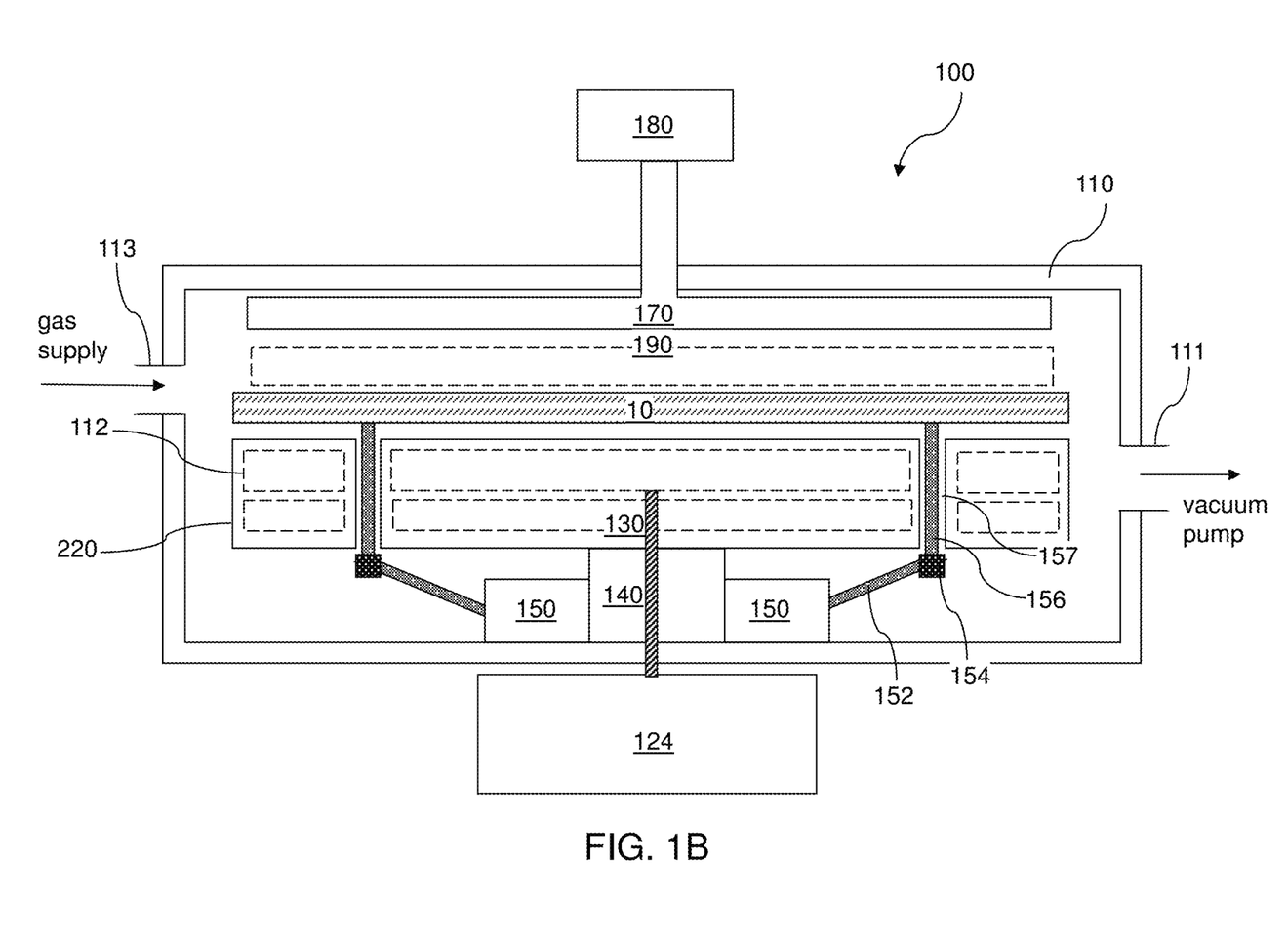
FIG. 1B is a vertical cross-sectional view of the first exemplary deposition chamber while lift pins are lifted according to a first embodiment of the present disclosure.
Figure 1C:
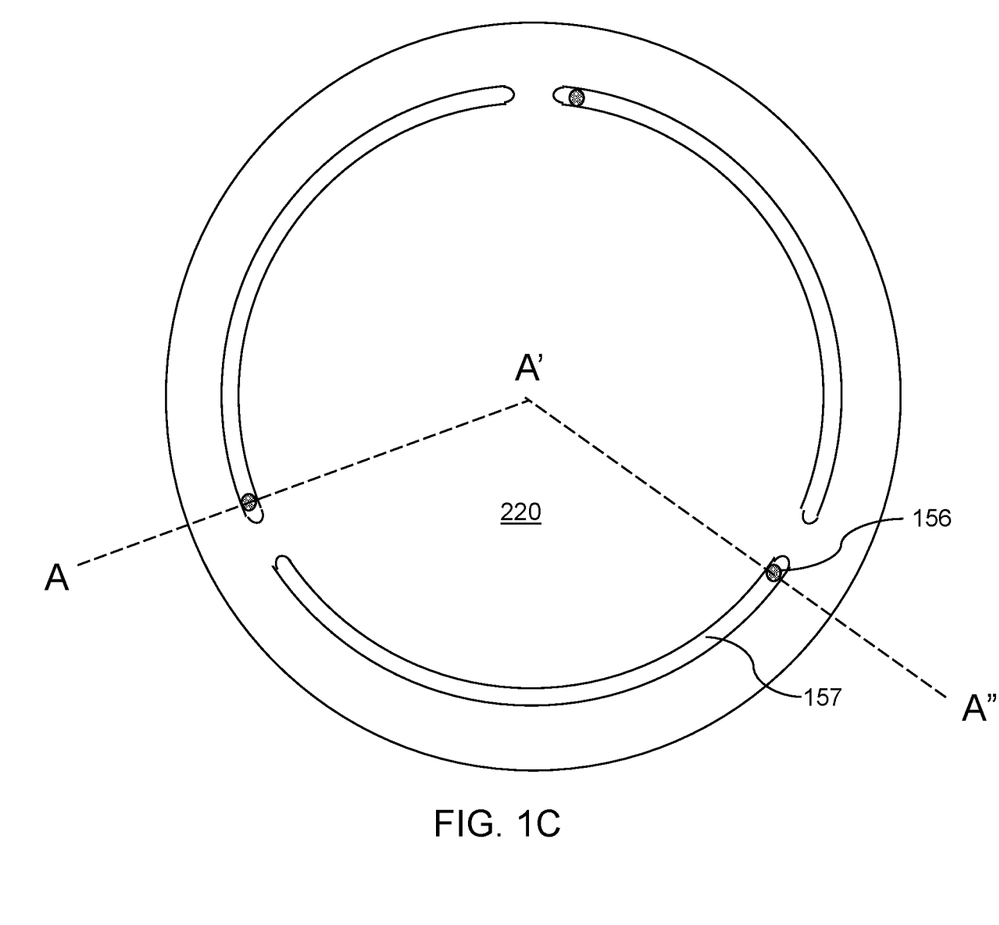
FIG. 1C is a top-down view of the electrostatic chuck and the lift pins of the first exemplary deposition chamber of FIGS. 1A and 1B.

Referring to FIGS. 1A-1C, a first exemplary deposition chamber 100 according to a first embodiment of the present disclosure is illustrated. FIG. 1A is a vertical cross-sectional view of the first exemplary deposition chamber 100 while lift pins 156 are retracted. FIG. 1B is a vertical cross-sectional view of the first exemplary deposition chamber 100 while lift pins 156 are lifted. FIG. 1C is a top-down view of an electrostatic chuck 220 and the lift pins 156 of the first exemplary deposition chamber 100. In one embodiment, the first exemplary deposition chamber may be a plasma-enhanced chemical vapor deposition (PECVD) process chamber.

The first exemplary deposition chamber 100 includes a process chamber configured to perform a deposition process, such as a PECVD process. The first exemplary deposition chamber 100 can include a vacuum chamber defined by a vacuum enclosure 110. The vacuum enclosure 110 includes multiple components such as static enclosure walls and at least one sealable opening that can be sealed by a movable door or a movable cap. For example, an opening may be provided in a sidewall of the static enclosure walls, and a slit valve may be provided to enable transfer of a substrate (such as a semiconductor wafer) therethrough. The slit valve may be configured to move out of the path of the transfer of the substrate during the transfer of the substrate, and slide into a sealing position once the substrate transfer is complete. The opening in the static enclosure walls may be connected to a transfer chamber (not illustrated), which may be maintained under vacuum or under reduced pressure to minimize influx of contaminants into the vacuum chamber and to facilitate maintenance of the base pressure within the vacuum enclosure 110. At least one vacuum pump (not expressly shown) can be attached to the vacuum enclosure 110 through a pumping port 111. The at least one vacuum pump can be configured to maintain the base pressure of the vacuum enclosure 110 in a range from 0.01 mTorr to 1 mTorr after a suitable outgassing process. The at least one vacuum pump may include a tandem combination of a turbo pump and a mechanical pump. The mechanical pump may be connected to the exhaust of the turbo pump, and can function as a roughing pump. The intake side of the turbo pump can be connected to the pumping port of the vacuum enclosure 110 to enable low base pressure in the vacuum enclosure 110.

A gas supply manifold 113 configured to provide influx of at least one process gas into the vacuum enclosure 110 may be provided in the first exemplary deposition chamber 100. The gas supply manifold 113 may be configured to provide influx of the at least one process gas through a sidewall of the vacuum enclosure 110 located on an opposite side of the pumping port 111. The at least one process gas may include any process gas that can be employed for any known PECVD process in the art. Optionally, the gas supply manifold may be configured to provide a carrier gas, a purge gas, and/or a backfill gas.

An electrostatic chuck 220 is located within the vacuum enclosure 110. The electrostatic chuck 220 includes a dielectric matrix having a planar top surface on which a substrate 10, such as a semiconductor wafer can be disposed. The electrostatic chuck 220 includes a lower electrode 112, which may have the shape of a conductive plate. The electrostatic chuck 220 can have a flat top surface, which can be a top surface of the dielectric matrix. The top surface of the lower electrode 112 can be vertically spaced from the top surface of the dielectric matrix (i.e., from the top surface of the electrostatic chuck 220) by a uniform vertical spacing to provide uniform chucking force between the substrate 10 and the lower electrode 112 upon application of a uniform direct current bias voltage to the lower electrode 112.

A heating unit 130 configured to heat the top surface of the electrostatic chuck 220 can be provided inside the vacuum enclosure 110 or outside the vacuum enclosure. For example, the heating unit 130 may be embedded in a lower portion of the electrostatic chuck 220 underneath the lower electrode 112. In one embodiment, the electrostatic chuck 220 may be stationary relative to the vacuum enclosure 110. For example, the electrostatic chuck 220 may be affixed to a bottom plate of the vacuum enclosure 110 by a support pedestal 140. The combination of the chuck 220 and the support pedestal 140 may together form a susceptor.

The lower electrode 112 can have a uniform thickness, and can include a metallic material. The lower electrode 112 may be encased within a dielectric matrix material of the electrostatic chuck 220, which may include a ceramic material, quartz, aluminum oxide, or any other suitable dielectric material that can provide mechanical strength and can withstand the elevated temperature during a deposition process.

The lower electrode 112 can be connected to a bottom radio frequency (RF) power source 124, which can be configured to provide bottom radio frequency (RF) power for plasma enhanced chemical deposition (PECVD) processes to be performed in the first exemplary deposition chamber 100. Further, an upper radio frequency (RF) electrode 170 can be located within the vacuum enclosure 110, can overlie the electrostatic chuck 220, and can be connected to a top radio frequency power source 180. Generally, at least one RF power source (124, 180) can be provided, which is configured to apply a radio frequency signal for generating a plasma into the vacuum enclosure 110 in a plasma zone 190, which is located between the electrostatic chuck 220 and the upper electrode 170.

According to an aspect of the present disclosure, the electrostatic chuck 220 can have at least one hole 157 therethrough. For example, the at least one hole 157 may comprise a plurality of arc-shaped holes 157 therethrough. As used herein, an arc-shaped hole refers to a hole having the contour of an arc of a circle. Thus, an arc-shaped hole can be elongated with a uniform radius of curvature. A plurality of lift pins 156 can be located within a respective arc-shaped hole 157 of the plurality of arc-shaped holes 157. The plurality of lift pins 156 can be configured to protrude above a horizontal plane including the flat top surface of the electrostatic chuck 220 in a raised position, and to be retracted below the horizontal plane including the flat top surface of the electrostatic chuck 220 in a retracted position. The outer sidewall of the electrostatic chuck 220 can be cylindrical, and can be equidistant from the vertical axis passing through the geometrical center of the electrostatic chuck 220. As used herein, a geometrical center of an element refers to the center of mass of a hypothetical object having the same volume as the element and having a uniform density throughout.

In one embodiment, each arc-shaped hole 157 can have an inner convex vertical sidewall having a first radius of curvature that is the same as the distance between the inner convex vertical sidewall and the vertical axis passing through the geometrical center of the electrostatic chuck 220, and an outer concave vertical sidewall having a second radius of curvature that is the same as the distance between the outer concave vertical sidewall and the vertical axis passing through the geometrical center of the electrostatic chuck 220. Each inner convex vertical sidewall can have a convex arc in a horizontal cross-sectional profile and a vertical line in a vertical cross-sectional profile. Each outer concave vertical sidewall can have a concave arc in a horizontal cross-sectional profile and a vertical line in a vertical cross-sectional profile.

In one embodiment, each of the plurality of arc-shaped holes 157 comprises an inner convex vertical sidewall having a first uniform lateral distance from the vertical axis passing through the geometrical center of the electrostatic chuck 220, and an outer concave vertical sidewall having a second uniform lateral distance from the vertical axis. The lift pines 156 may rotate about the vertical axis of the electrostatic chuck 220 in the respective holes 157 when they are lifted or retracted.

The plurality of lift pins 156 can be located on a rotor structure 150 that is configured to rotate around the vertical axis passing through the geometrical center of the electrostatic chuck 220. Each lift pin 156 can be connected to the rotor structure through a respective connector structure 152. Optionally, a joint structure 154 may be employed to connect the connector structure 152 and the lift pin 156. In one embodiment, the joint structure 154 may be ring-shaped to enhance structural integrity. For example, the rotor structure 150 can be mounted around a cylindrical sidewall of the support pedestal 140. In this case, the electrostatic chuck 220 and the support pedestal 140 is stationary with respect to the vacuum enclosure 110. The combination of the rotor structure 150, the lift pins 156, the connector structures 152, and the optional joint structures 154 can move along the vertical direction (i.e., the axial direction of the electrostatic chuck 220) and can rotate around the vertical axis passing through the geometrical center of the electrostatic chuck 220. The combination of the rotor structure 150, the lift pins 156, the connector structures 152, and the optional joint structures 154 can be employed to lift the substrate 10 from above the top surface of the electrostatic chuck 220 and to rotate the substrate 10 around the vertical axis passing through the geometrical center of the electrostatic chuck 220, and is herein referred to as a lift-and-rotation unit (150, 156, 152, 154).

In one embodiment, the total number of the arc-shaped holes 157 can be an integer N that is greater than 2, i.e., an integer such as 3, 4, 5, 6, 7, 8, etc. In one embodiment, the plurality of arc-shaped holes 157 can comprise three or more, such as three to six arc-shaped holes 157. The total number of lift pins 156 can be the same as the total number of the arc-shaped holes 157. In one embodiment, each of the plurality of arc-shaped holes 157 azimuthally extends around the vertical axis passing through the geometrical center of the electrostatic chuck 220 at least by $2\pi/(N+1)$ radian and is less than $2\pi/N$ radian, wherein N is an integer in a range from 3 to 12. For example, if 3 arc-shaped holes 157 and 3 lift pins 156 are present, each of the plurality of arc-shaped holes 157 azimuthally extends around the vertical axis passing through the geometrical center of the electrostatic chuck 220 by an azimuthal angle range that is at least $\pi/2$ radian and is less than $2\pi/3$ radian, i.e., at least 90 degrees and less than 120 degrees.

In one embodiment, each of the plurality of arc-shaped holes 157 can be radially spaced from the vertical axis passing through the geometrical center of the electrostatic chuck 220 by a same lateral spacing, i.e., the distance between the inner convex vertical sidewall and the vertical axis. The lift distance by which the top surfaces of the lift pins 156 protrude above the horizontal plane including the planar top surface of the electrostatic chuck 220 may be in a range from 1 mm to 10 mm, although lesser and greater lift distances can also be employed.

Figure 2A:
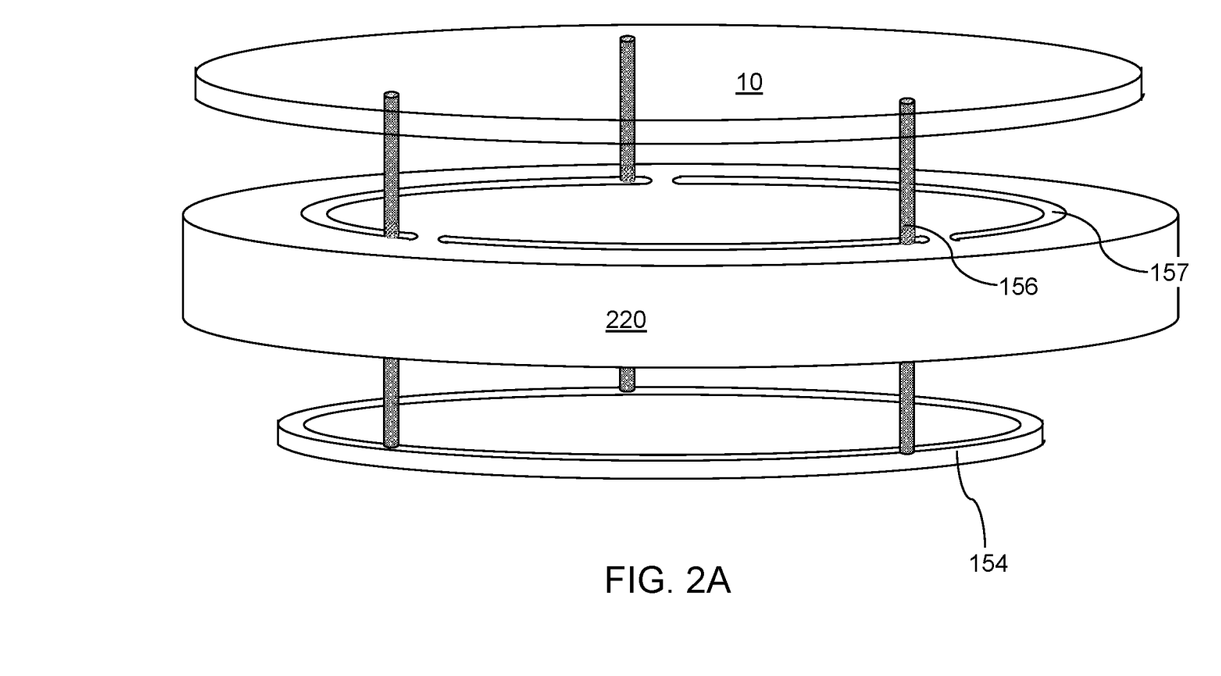
FIG. 2A is a perspective view of an electrostatic chuck, lift pins, and a rotor structure of the first exemplary deposition chamber of FIGS. 1A-1C while the lift pins are lifted up.
Figure 2B:
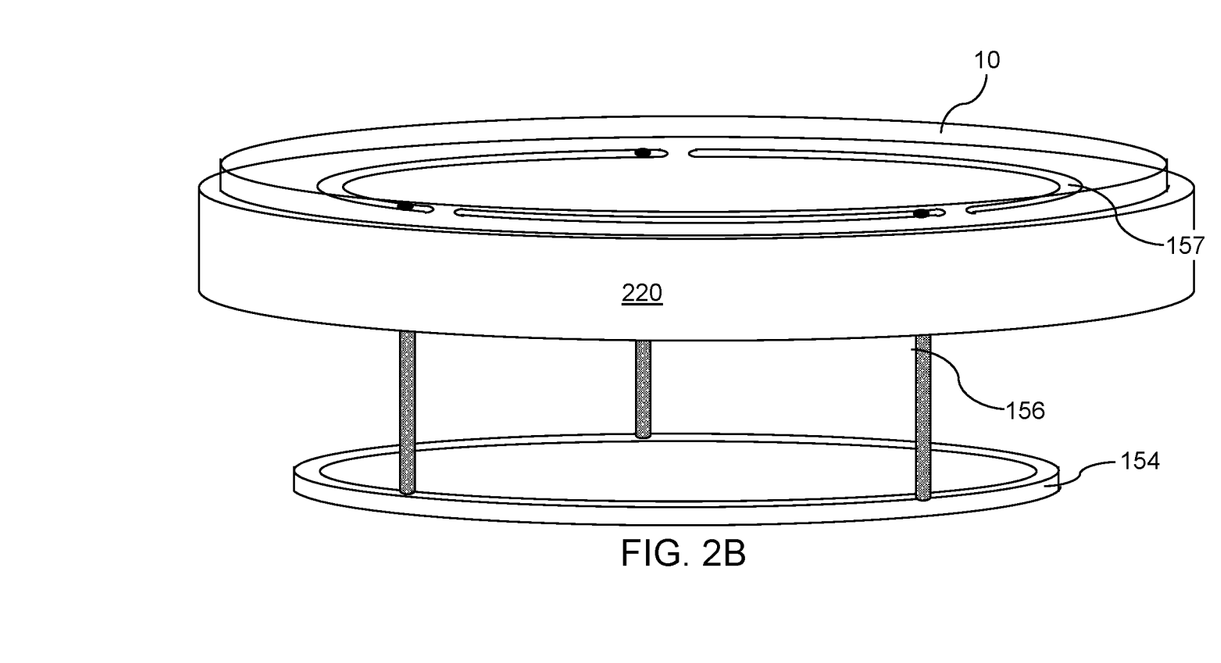
FIG. 2B is a perspective view of an electrostatic chuck, lift pins, and a rotor structure of the first exemplary deposition chamber of FIGS. 1A-1C while the lift pins are retracted.

Referring to FIGS. 2A and 2B, the electrostatic chuck 220, the lift pins 156, and the rotor structure 150 of the first exemplary deposition chamber of FIGS. 1A-1C are illustrated in perspective views. FIG. 2A corresponds to the configuration in which the lift pins 156 are lifted up to lift the substrate 10 from the electrostatic chuck 220. FIG. 2B corresponds to the configuration in which the lift pins 156 are retracted to place the substrate 10 on the planar top surface of the electrostatic chuck.

Referring to FIGS. 1A-1C, 2A, and 2B collectively and according to various embodiments of the present disclosure, a film can be deposited in a deposition chamber 100. The film may comprise any suitable insulating, semiconductor or conductive film. For example, the film may comprise an amorphous carbon hard mask film. Generally, the deposition chamber 100 can comprise an electrostatic chuck 220 having a flat top surface and located within a vacuum enclosure 110, and a lift-and-rotation unit (150, 156, 152, 154) has lift pins 156 extending through the electrostatic chuck 220 at a position that is laterally offset from a vertical axis passing through a geometrical center of the electrostatic chuck 220.

A substrate 10 can be disposed on top of the electrostatic chuck 220. A first portion of a film can be deposited on the substrate 10 by performing a first deposition step, which may be, for example, a plasma enhanced chemical vapor deposition step. The substrate 10 can be lifted from the electrostatic chuck 220 employing the lift-and-rotation unit (150, 156, 152, 154). The substrate 10 can be rotated relative to the electrostatic chuck 220 by rotating the lift-and-rotation unit (150, 156, 152, 154) while the substrate 10 is supported by the lift pins 156 of the lift-and-rotation unit (150, 156, 152, 154). The substrate 10 can be placed on the electrostatic chuck 220 after the substrate 10 is rotated. A second portion of the film can be deposited on the substrate 10 by performing a second deposition step.

Generally, two or more deposition steps can be performed with an intermediate wafer rotation between each sequentially neighboring pair of deposition steps. In one embodiment, the total number of deposition steps can be the same as, or may be greater than, the total number of lift pins 156.

In one embodiment, N lift pins 156 may be provided, in which N is an integer greater than 2. In one embodiment, the substrate 10 can be rotated relative to the electrostatic chuck 220 by $2\pi/N$ radian, in which N is an integer greater than 2. In one embodiment, the combination of rotation of the electrostatic chuck 220 by $2\pi/N$ radian and deposition of an additional film may be repeated at least (N−2) times after deposition of the second film on the substrate 10. For example, if the substrate 10 comprises a semiconductor wafer having a wafer flat, then the wafer flat during the second deposition step is offset from its position during the first deposition step by greater than zero and less than 360 degrees, such as by $2\pi/N$ radians.

In one embodiment, the electrostatic chuck 220 comprises a plurality of arc-shaped holes 157 therethrough, and the lift-and-rotation unit (150, 156, 152, 154) comprises a plurality of lift pins 156 located within a respective arc-shaped hole 157 of the plurality of arc-shaped holes 157, and is configured to protrude above a horizontal plane including the flat top surface of the electrostatic chuck 220 in a raised position and to be retracted below the horizontal plane including the flat top surface of the electrostatic chuck 220 in a retracted position.

In one embodiment, the deposition chamber comprises a gas supply manifold 113 configured to provide influx of gas into the vacuum enclosure 110, and a pumping port 111 connected to the vacuum enclosure 110. A plasma can be formed between the substrate 10 and an upper electrode 170 overlying the electrostatic chuck 220 during deposition of the first film and the second film and any additional film that is subsequently deposited.

Figure 3A:
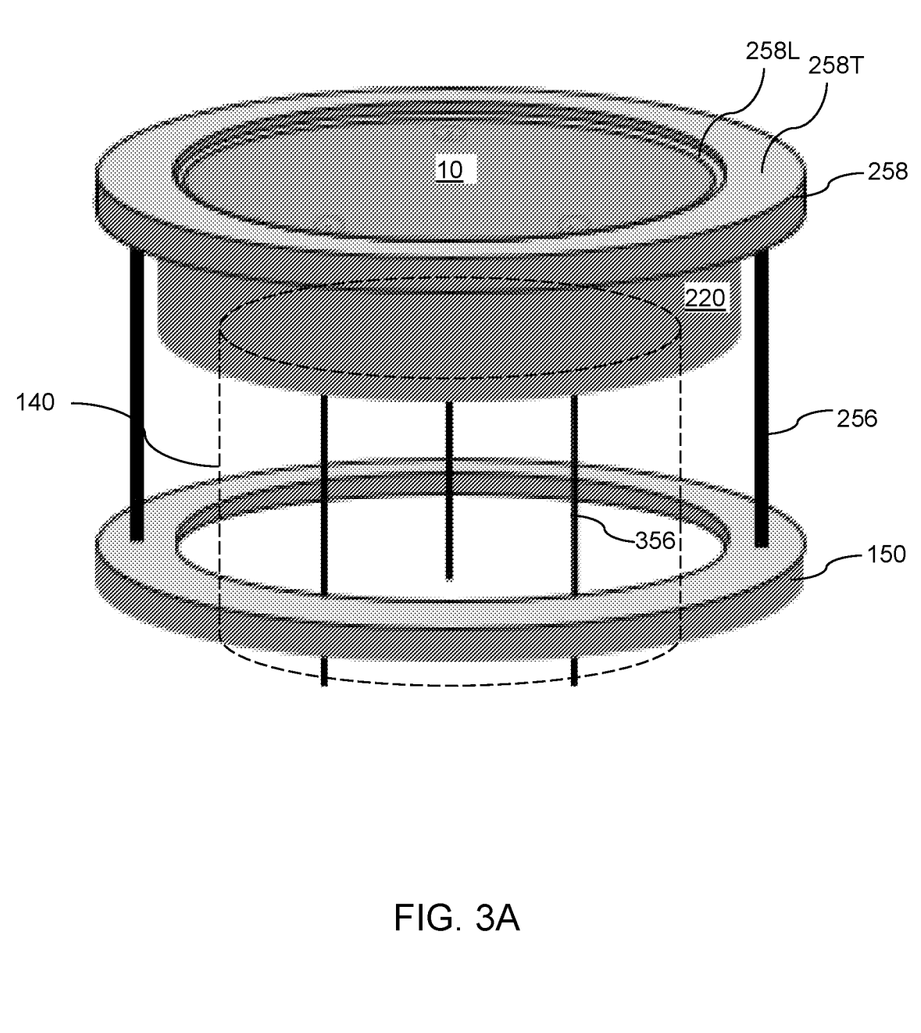
FIG. 3A is a perspective view of an electrostatic chuck, lift pins, and a rotor structure of a second exemplary deposition chamber according to a second embodiment of the present disclosure.
Figure 3B:
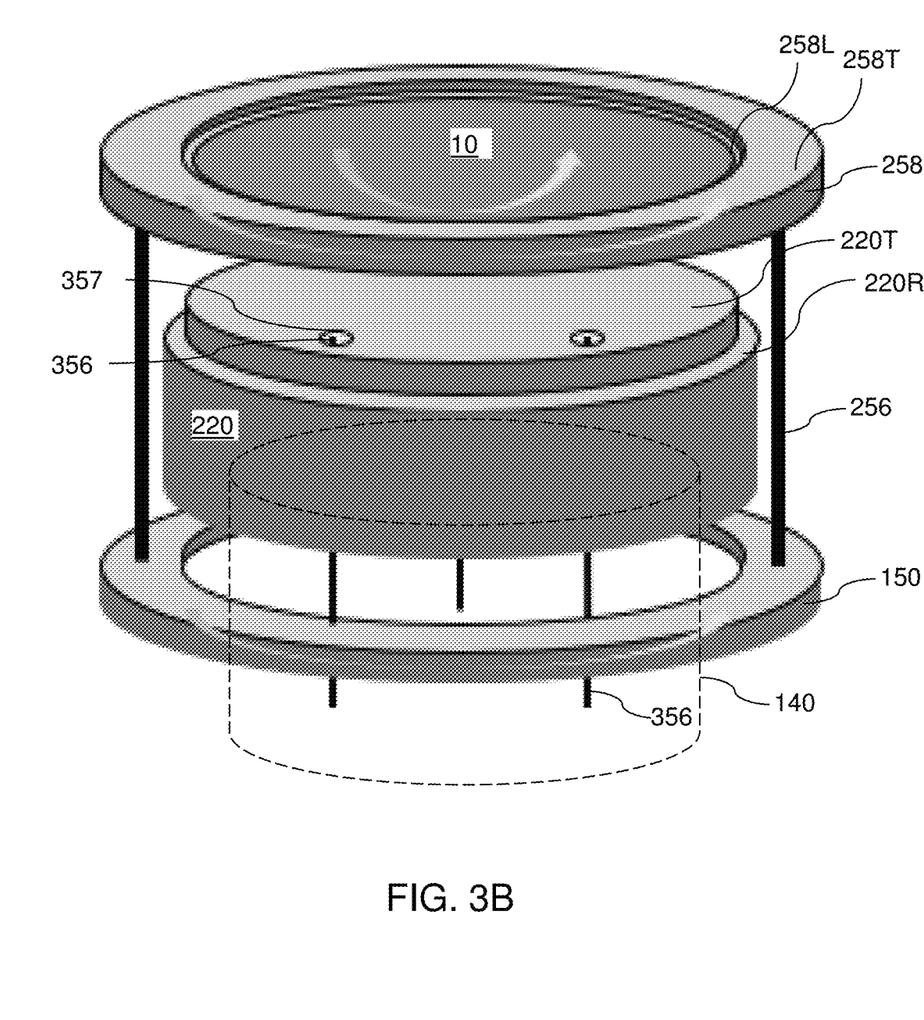
FIG. 3B is a perspective view of an electrostatic chuck, lift pins, and a rotor structure of the second exemplary deposition chamber according to the second embodiment of the present disclosure.

Referring to FIGS. 3A and 3B, internal components of a second exemplary deposition chamber are illustrated according to a second embodiment of the present disclosure. The second exemplary deposition chamber can be derived from the first exemplary deposition chamber 100 illustrated in FIGS. 1A-1C by changing the shape of the electrostatic chuck 220, and by employing a different lift-and-rotation unit than the lift-and-rotation unit (150, 156, 152, 154) in the first exemplary deposition chamber 100. All other components except the electrostatic chuck 220 and the different lift-and-rotation unit can be the same between the first exemplary deposition chamber 100 and the second exemplary deposition chamber of the present disclosure. Thus, components common between the first exemplary deposition chamber 100 and the second exemplary deposition chamber are omitted in FIGS. 3A and 3B. The location of a support pedestal 140 is illustrated in dotted lines in FIGS. 3A and 3B. FIG. 3A is a perspective view of the second exemplary deposition chamber while a lift ring 258 is retracted, and FIG. 3B is a perspective view of the second exemplary deposition chamber while the lift ring is raised.

Generally, the electrostatic chuck 220 can be stationary with respect to the vacuum enclosure 110. The electrostatic chuck 220 can have a flat top surface. A plurality of cylindrical holes 357 can vertically extend through the electrostatic chuck 220, and a plurality of cylindrical lift pins 356 can be located within a respective one of the plurality of cylindrical holes. The plurality of cylindrical lift pins 356 can be configured to move vertically. The cylindrical lift pins 356 can be employed to raise or lower a substrate 10 without rotating the substrate 10. The electrostatic chuck 220 can be stationary relative to the vacuum enclosure 110, and the cylindrical lift pins 356 can move vertically without lateral movement.

The second exemplary deposition chamber can include a lift ring 258 that laterally surrounds the electrostatic chuck 220. The lift ring 258 has an annular top surface having an inner periphery and an outer periphery. The diameter of the inner periphery can be less than the diameter of the substrate 10 so that the lift ring 258 can support the substrate 10 and lift up the substrate 10 in a raised position.

According to an aspect of the present disclosure, the lift ring 258 can be configured to rotate around the electrostatic chuck 220. In one embodiment, the lift ring 258 can be connected to a rotor structure 150 through vertically-extending connector structures 256. The vertically-extending connector structures 256 can have shapes of cylindrical pillars. The rotor structure 150 is configured to rotate around the vertical axis passing through the geometrical center of the electrostatic chuck 220.

For example, the rotor structure 150 can be mounted around a cylindrical sidewall of the support pedestal 140. The combination of the rotor structure 150, the lift ring 258, and the vertically-extending connector structures 256 can move along the vertical direction (i.e., the axial direction of the electrostatic chuck 220) and can rotate around the vertical axis passing through the geometrical center of the electrostatic chuck 220. The combination of the rotor structure 150, the lift ring 258, and the vertically-extending connector structures 256 can be employed to lift the substrate 10 from above the top surface of the electrostatic chuck 220 and to rotate the substrate 10 around the vertical axis passing through the geometrical center of the electrostatic chuck 220, and is herein referred to as a lift-and-rotation unit (150, 258, 256).

The lift ring 258 can have an annular top surface 258T and an annular lip 258L which is recessed with respect to the top surface 258T. The top surface 258T radially surrounds the lip 258L. The inner diameter of the lip 258L is smaller than the outer diameter of the substrate 10 such that the lip 258L can support the outer portion of the substrate 10 (i.e., the outer portion of the substrate 10 is located on the lip 258L. The outer diameter of the lip 258L corresponds to the inner diameter of the top surface 258T. The inner diameter of the top surface 258T is larger than the diameter of the substrate 10 such that the top surface 258T surrounds the edge of the substrate 10 and prevents the substrate 10 from slipping radially off the lip 258L.

As shown in FIG. 3B, the electrostatic chuck 220 contains an inner planar top surface 220T surrounded by an annular recess 220R. When the lift ring 258 is retracted (i.e., recessed), the lip 258L is located in the annular recess 220R of the chuck 220. The top surface of the lip 258L may be coplanar with or located below the top surface 220T of the chuck 220. Thus, the substrate 10 is located on the top surface 220T of the chuck 220 when the lift ring 258 is retracted. In contrast, when the lift ring 258 is lifted, the lip 258L of the lift ring 258 lifts the substrate 10 off the electrostatic chuck 220 above its top surface 220T when the lift ring 258 is in the raised position. The lift ring 258 then places the substrate 10 on the inner planar flat top surface 220T of the electrostatic chuck when the lift ring 258 is moved back into the retracted position.

In one embodiment, a plurality of vertically-extending connector structures 256 can be connected to a bottom surface of the lift ring 258. A rotor structure 150 can be connected to bottom ends of the plurality of vertically-extending connector structures 256, and can be configured to rotate around the electrostatic chuck 220 with the lift ring 258. In one embodiment, the rotational axis of the lift ring 258 can coincide with the vertical axis passing through the geometrical center of the electrostatic chuck 220. In one embodiment, the lift ring 258 can be configured to rotate around the vertical axis passing through the geometrical center of the electrostatic chuck 220 at least by $2\pi/N$ radian. N is an integer in a range from 2 to 12. Thus, upon repetition of rotation of the substrate 10 N times, the substrate 10 can be rotated at least by one full rotation, i.e., at least by 360 degrees around the vertical axis passing through the geometrical center of the electrostatic chuck 220.

A film can be deposited in the second exemplary deposition chamber. Generally, the second exemplary deposition chamber can include an electrostatic chuck 220 having a flat top surface and located within a vacuum enclosure 110, and a lift-and-rotation unit (150, 258, 256) laterally surrounding, the electrostatic chuck 220 at a position that is laterally offset from a vertical axis passing through a geometrical center of the electrostatic chuck 220.

For example, a substrate 10 can be disposed on top of the electrostatic chuck 220 and optionally on the lip 258L of the lift ring 258 in the retracted position. A first portion of the film can be deposited on the substrate 10 by performing a first deposition step, which may be, for example, a plasma enhanced chemical vapor deposition step. The substrate 10 can be lifted from the electrostatic chuck 220 employing the lip 258L of the lift ring 258 of the lift-and-rotation unit (150, 258, 256). The substrate 10 can be rotated relative to the electrostatic chuck 220 by rotating the lift-and-rotation unit (150, 258, 256) while the substrate 10 is supported by the lift-and-rotation unit (150, 258, 256) such as the lift ring 258. The substrate 10 can be placed on the electrostatic chuck 220 after the substrate 10 is rotated by retracting the lift ring 258. A second portion of the film can be deposited on the substrate 10 by performing a second deposition step.

Generally, two or more deposition steps can be performed with an intermediate wafer rotation between each sequentially neighboring pair of deposition steps. In one embodiment, the substrate 10 can be rotated relative to the electrostatic chuck 220 at least by $2\pi/N$ radian, in which N is an integer greater than 1. In one embodiment, the lift-and-rotation unit (150, 258, 256) includes a lift ring 258 that laterally surrounds the electrostatic chuck 220 and has an annular top surface 258T surrounding a recessed lip 258L which supports the substrate 10. The lift ring 258 can be configured to rotate around the electrostatic chuck 220. In one embodiment, the combination of rotation of the lift ring 258 around the electrostatic chuck 220 by $2\pi/N$ radian and deposition of an additional film portions may be repeated at least (N−2) times after deposition of the second film portion on the substrate 10. In other words, during each deposition step, 1/N of the film thickness is deposited. The substrate 10 is rotated 360/N degrees after each deposition step. After each rotation of the substrate, another 1/N of the film thickness is deposited. The sequence of deposition and rotation steps is repeated N times, where N is an integer greater than 1.

In one embodiment, the deposition chamber comprises a gas supply manifold 113 configured to provide influx of gas into the vacuum enclosure 110, and a pumping port 111 connected to the vacuum enclosure 110. A plasma can be formed between the substrate 10 and an upper electrode 170 overlying the electrostatic chuck 220 during deposition of the first portion of the film and the second portion of the film and any additional portions of the film that is subsequently deposited.

The present inventor realized that asymmetry of film thickness deposited by PECVD depends on asymmetry of plasma distribution, gas flow distribution and substrate temperature distribution. If the susceptor containing the chuck 220 is rotated, then the asymmetry of plasma distribution and gas flow distribution may be reduced. However, the substrate 10 temperature distribution asymmetry is not reduced because it is caused by the susceptor (i.e., due to asymmetry of chuck 220 heater temperature distribution, asymmetry of the chuck and substrate thermal conductivity, asymmetry of chuck 220 surface roughness, and/or asymmetry of the electrostatic chucking force of the chuck 220).

Specifically, during PECVD deposition of a carbon hard mask film (e.g., amorphous carbon hard mask layer used as a mask to pattern underlying device layers), the substrate is heated to a high temperature (>500° C.) to improve the selectivity for deposition. The substrate is heated by the susceptor, which has an electrostatic chuck 220 that chucks the substrate to increase heat transfer efficiency and stability. In the higher temperature process, the temperature distribution increases due to heat loss. Johnson Labec force is used for chucking at high temperatures. However, this force depends on the distance between the chuck 220 surface and the substrate 10. Thus, chuck 220 surface roughness affects this distance and thus affects the substrate 10 temperature distribution. It is difficult to make the chuck 220 surface roughness uniform, and it changes due to contact friction with the substrate, causing asymmetric distribution.

Therefore, by rotating the substrate 10 relative to the chuck 220 during deposition reduces the asymmetry of plasma distribution, gas flow distribution and substrate temperature distribution. Thus, rotation of the substrate 10 between deposition steps has the effect of averaging out the thickness variations across the top surface of the substrate. Thus, the overall thickness uniformity of the deposited film on top of the substrate 10 can increase by rotating the substrate 10 relative to the chuck 220 between the multiple deposition steps of a film deposition process. A typical deposition process can include a sequence such as a first deposition step, a first substrate rotation step, a second deposition step, a second substrate rotation step, and so on up to the final deposition step. Rotation of the substrate 10 can be effected by a lift-and-rotation unit, which may include a combination of a rotor structure 150, lift pins 156, connector structures 152, and optional joint structures 154, or may include a combination of a rotor structure 150, a lift ring 258, and vertically-extending connector structures 256.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A deposition chamber comprising:
   a vacuum enclosure;
   an electrostatic chuck having a flat top surface located within the vacuum enclosure;
   a lift-and-rotation unit extending through or laterally surrounding the electrostatic chuck at a position that is laterally offset from a vertical axis passing through a geometrical center of the electrostatic chuck;

a gas supply manifold configured to provide influx of gas into the vacuum enclosure; and a pumping port connected to the vacuum enclosure;

wherein:

the lift-and-rotation unit comprises a plurality of lift pins;

the electrostatic chuck has plurality of arc-shaped holes therethrough; and the plurality of lift pins are located within a respective arc-shaped hole of the plurality of arc-shaped holes and configured to protrude above a horizontal plane including the flat top surface of the electrostatic chuck in a raised position and to be retracted below the horizontal plane including the flat top surface of the electrostatic chuck in a retracted position.

2. The deposition chamber of claim 1, wherein the plurality of arc-shaped holes comprise three or more arc-shaped holes.

3. The deposition chamber of claim 1, wherein each of the plurality of arc-shaped holes comprises:

an inner convex vertical sidewall having a first uniform lateral distance from the vertical axis passing through the geometrical center of the electrostatic chuck; and an outer concave vertical sidewall having a second uniform lateral distance from the vertical axis.

4. The deposition chamber of claim 1, wherein the plurality of lift pins is located on a rotor structure that is configured to rotate around the vertical axis and to rotate the lift pins around the vertical axis in the respective arc-shaped holes.

5. The deposition chamber of claim 1, wherein each of the plurality of arc-shaped holes azimuthally extends around a vertical axis passing through a geometrical center of the electrostatic chuck at least by $2\pi/(N+1)$ radian, wherein N is an integer in a range from 3 to 12.

6. The deposition chamber of claim 5, wherein each of the plurality of arc-shaped holes is radially spaced from the vertical axis passing through the geometrical center of the electrostatic chuck by a same lateral spacing.

7. A deposition chamber comprising:

a vacuum enclosure;

an electrostatic chuck having a flat top surface located within the vacuum enclosure;

a lift-and-rotation unit extending through or laterally surrounding the electrostatic chuck at a position that is laterally offset from a vertical axis passing through a geometrical center of the electrostatic chuck;

a gas supply manifold configured to provide influx of gas into the vacuum enclosure; and a pumping port connected to the vacuum enclosure;

wherein the electrostatic chuck is stationary and not configured to rotate with respect to the vacuum enclosure.

8. A method of depositing a film in a deposition chamber, comprising:

providing a deposition chamber, wherein the deposition chamber comprises an electrostatic chuck having a flat top surface and located within a vacuum enclosure, and a lift-and-rotation unit extending through or laterally surrounding the electrostatic chuck at a position that is laterally offset from a vertical axis passing through a geometrical center of the electrostatic chuck;

disposing a substrate on top of the electrostatic chuck;

depositing a first film portion on the substrate;

lifting the substrate from the electrostatic chuck employing the lift-and-rotation unit;

rotating the lifted substrate relative to the electrostatic chuck by rotating the lift-and-rotation unit while the substrate is supported by the lift-and-rotation unit;

placing the substrate on the electrostatic chuck after the substrate is rotated; and depositing a second film portion on the substrate.

9. The method of claim 8, wherein the substrate is rotated relative to the electrostatic chuck by $2\pi/N$ radian, wherein N is an integer greater than 2.

10. The method of claim 9, further comprising repeating a combination of rotation of the electrostatic chuck by $2\pi/N$ radian and deposition of an additional film portion (N−2) times after deposition of the second film portion on the substrate.

11. The method of claim 9, wherein:

the electrostatic chuck comprises a plurality of arc-shaped holes therethrough; and the lift-and-rotation unit comprises a plurality of lift pins located within a respective arc-shaped hole of the plurality of arc-shaped holes, and is configured to protrude above a horizontal plane including the flat top surface of the electrostatic chuck in a raised position and to be retracted below the horizontal plane including the flat top surface of the electrostatic chuck in a retracted position.

12. The method of claim 9, wherein:

the lift-and-rotation unit comprises a lift ring laterally surrounding the electrostatic chuck and having an annular top surface; and the lift ring is configured to rotate around the electrostatic chuck.

13. The method of claim 9, wherein the film comprises a carbon hard mask film.

\* \* \* \* \*